United States Patent
Sasaki

(10) Patent No.: US 10,476,439 B2
(45) Date of Patent: Nov. 12, 2019

(54) POWER AMPLIFIER CIRCUIT

(71) Applicant: MURATA MANUFACTURING CO., LTD., Kyoto-fu (JP)

(72) Inventor: Kenji Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/107,865

(22) Filed: Aug. 21, 2018

(65) Prior Publication Data
US 2019/0006994 A1 Jan. 3, 2019

Related U.S. Application Data

(63) Continuation of application No. 15/709,099, filed on Sep. 19, 2017, now Pat. No. 10,128,797, which is a
(Continued)

(30) Foreign Application Priority Data

Dec. 14, 2015 (JP) ................................. 2015-243586
May 16, 2016 (JP) ................................. 2016-098075

(51) Int. Cl.
*H03F 1/02* (2006.01)
*H03F 1/56* (2006.01)
(Continued)

(52) U.S. Cl.
CPC ........... *H03F 1/0205* (2013.01); *H01L 25/00* (2013.01); *H03F 1/0261* (2013.01); *H03F 1/56* (2013.01);
(Continued)

(58) Field of Classification Search
CPC .................................................. H03F 1/0205
See application file for complete search history.

(56) References Cited

U.S. PATENT DOCUMENTS 7,012,469 B2    3/2006   Moriwaki et al.
7,026,876 B1 *  4/2006   Esfandiari ............ H03F 1/0261
                                                            330/295
(Continued)

FOREIGN PATENT DOCUMENTS

JP    S60-100806 A     6/1985
JP    2001-326540 A   11/2001
(Continued)

OTHER PUBLICATIONS

An Office Action issued by Taiwan Patent Office dated May 8, 2018, which corresponds to Taiwanese Patent Application No. 105141195 and is related to U.S. Appl. No. 15/709,099.

*Primary Examiner* — Patricia T Nguyen
(74) *Attorney, Agent, or Firm* — Studebaker & Brackett PC

(57) ABSTRACT

A power amplifier circuit includes a first amplifier transistor and a bias circuit. The first amplifier transistor amplifies a first signal and outputs a second signal. The bias circuit supplies a bias voltage or a bias current to the first amplifier transistor. The first amplifier transistor includes plural unit transistors disposed in a substantially rectangular region. The bias circuit includes first and second bias transistors and first and second voltage supply circuits. The first and second bias transistors respectively supply first and second bias voltages or first and second bias currents to the bases of unit transistors of first and second groups. The first and second voltage supply circuits respectively supply first and second voltages to the bases of the first and second bias transistors. The first and second voltages are decreased in accordance with a temperature increase. The second voltage supply circuit is disposed within the substantially rectangular region.

20 Claims, 13 Drawing Sheets

Related U.S. Application Data continuation of application No. 15/369,273, filed on Dec. 5, 2016, now Pat. No. 9,806,674.

(51) Int. Cl.
  *H03F 3/195* (2006.01)
  *H03F 3/213* (2006.01)
  *H03F 3/19* (2006.01)
  *H01L 25/00* (2006.01)

(52) U.S. Cl.
  CPC ............... *H03F 3/19* (2013.01); *H03F 3/195* (2013.01); *H03F 3/213* (2013.01); *H03F 2200/18* (2013.01); *H03F 2200/222* (2013.01); *H03F 2200/318* (2013.01); *H03F 2200/451* (2013.01)

(56) References Cited

U.S. PATENT DOCUMENTS

| | | |
|---|---|---|
| 7,109,800 B2 | 9/2006 | Noh et al. |
| 7,768,345 B2 | 8/2010 | Aoki |
| 2002/0097097 A1 | 7/2002 | Sugiura |
| 2004/0222848 A1 | 11/2004 | Shih et al. |
| 2006/0006947 A1 | 1/2006 | Feng et al. |
| 2008/0079495 A1 | 4/2008 | Amano |
| 2008/0116977 A1 | 5/2008 | Jung et al. |
| 2008/0186099 A1 | 8/2008 | Ishimaru et al. |
| 2009/0251220 A1 | 10/2009 | Matsuda et al. |
| 2010/0097147 A1 | 4/2010 | Hirayama |
| 2010/0327978 A1 | 12/2010 | Thor |
| 2014/0002188 A1 | 1/2014 | Chen et al. |
| 2014/0285268 A1 | 9/2014 | Tsutsui et al. |
| 2014/0347130 A1 | 11/2014 | Iijima et al. |
| 2015/0054587 A1 | 2/2015 | Yoshizaki |
| 2016/0079927 A1 | 3/2016 | Kamitani et al. |
| 2016/0134241 A1* | 5/2016 | Sugiura ................ H03F 1/0205 330/296 |
| 2017/0033748 A1 | 2/2017 | Rajendran et al. |
| 2017/0077877 A1* | 3/2017 | Anderson ............. B82Y 10/00 |
| 2018/0358933 A1* | 12/2018 | Matsui .................... H03F 1/302 |

FOREIGN PATENT DOCUMENTS

| | | |
|---|---|---|
| JP | 2002-217378 A | 8/2002 |
| JP | 2006-147665 A | 6/2006 |

\* cited by examiner

POWER AMPLIFIER CIRCUIT

CROSS REFERENCE TO RELATED APPLICATIONS

This is a Continuation Application of U.S. patent application Ser. No. 15/709,099, filed Sep. 19, 2017, which claims benefit of priority to Japanese Patent Application 2015-243586 filed Dec. 14, 2015, and to Japanese Patent Application No. 2016-098075 filed May 16, 2016, the entire content of which is incorporated herein by reference.

TECHNICAL FIELD

The present disclosure relates to a power amplifier circuit.

BACKGROUND

In mobile communication devices, such as cellular phones, a power amplifier circuit is used for amplifying power of a radio frequency (RF) signal to be transmitted to a base station. As an amplifier element of a power amplifier circuit, a bipolar transistor, such as a heterojunction bipolar transistor (HBT), is used.

When a bipolar transistor is driven with a constant base-emitter voltage, a collector current increases due to a temperature rise. An increased collector current increases power consumption, which raises the temperature of the transistor element and further increases the collector current. This is called thermal runaway (positive feedback). It is thus desirable to suppress the occurrence of thermal runaway of a bipolar transistor used in a power amplifier circuit. Japanese Unexamined Patent Application Publication No. 2006-147665 discloses the following configuration for suppressing the occurrence of thermal runaway. In order to transfer a temperature change in a bipolar transistor to a temperature control element, thermal conduction wiring using a high thermal conductive metal is provided so that the bias voltage to be supplied to the bipolar transistor can be controlled.

SUMMARY

In the configuration disclosed in the above-described publication, the occurrence of thermal runway is suppressed by the use of thermal conduction wiring that reduces the time for transferring a temperature change in the bipolar transistor to the temperature control element. This configuration increases the cost. Additionally, in some power amplifier circuits, a bipolar transistor constituted by plural unit transistors (also called fingers) may be used. In such a bipolar transistor, the temperature distribution in the transistor element may become nonuniform. More specifically, the temperature in the central portion of the transistor element becomes high, while the temperature in the peripheral portion becomes low. Such a temperature distribution makes the operation characteristics differ between the unit transistors formed in the central portion of the transistor element and those formed in the peripheral portion, thereby decreasing the distortion characteristics of the bipolar transistor. The above-described publication does not disclose any measures to improve the uniformity of the temperature distribution in the transistor element of a bipolar transistor constituted by plural unit transistors.

The present disclosure has been made in view of the above-described background. It is an object of the present disclosure to improve the uniformity of the temperature distribution in a bipolar transistor constituted by plural unit transistors used in a power amplifier circuit.

According to preferred embodiments of the present disclosure, there is provided a power amplifier circuit including a first amplifier transistor and a bias circuit. The first amplifier transistor amplifies a first signal and outputs a second signal. The bias circuit supplies a bias voltage or a bias current to the first amplifier transistor. The first amplifier transistor includes a plurality of unit transistors disposed in a substantially rectangular region. The bias circuit includes first and second bias transistors and first and second voltage supply circuits. The first bias transistor supplies a first bias voltage or a first bias current to a base of a unit transistor of a first group among the plurality of unit transistors. The second bias transistor supplies a second bias voltage or a second bias current to a base of a unit transistor of a second group among the plurality of unit transistors. The first voltage supply circuit supplies a first voltage to a base of the first bias transistor. The first voltage is decreased in accordance with a temperature increase. The second voltage supply circuit supplies a second voltage to a base of the second bias transistor. The second voltage is decreased in accordance with a temperature increase. The second voltage supply circuit is disposed within the substantially rectangular region.

According to preferred embodiments of the present disclosure, it is possible to improve the uniformity of the temperature distribution in a bipolar transistor constituted by plural unit transistors used in a power amplifier circuit.

Other features, elements, characteristics and advantages of the present disclosure will become more apparent from the following detailed description of preferred embodiments of the present disclosure with reference to the attached drawings.

DETAILED DESCRIPTION

Figure 1:
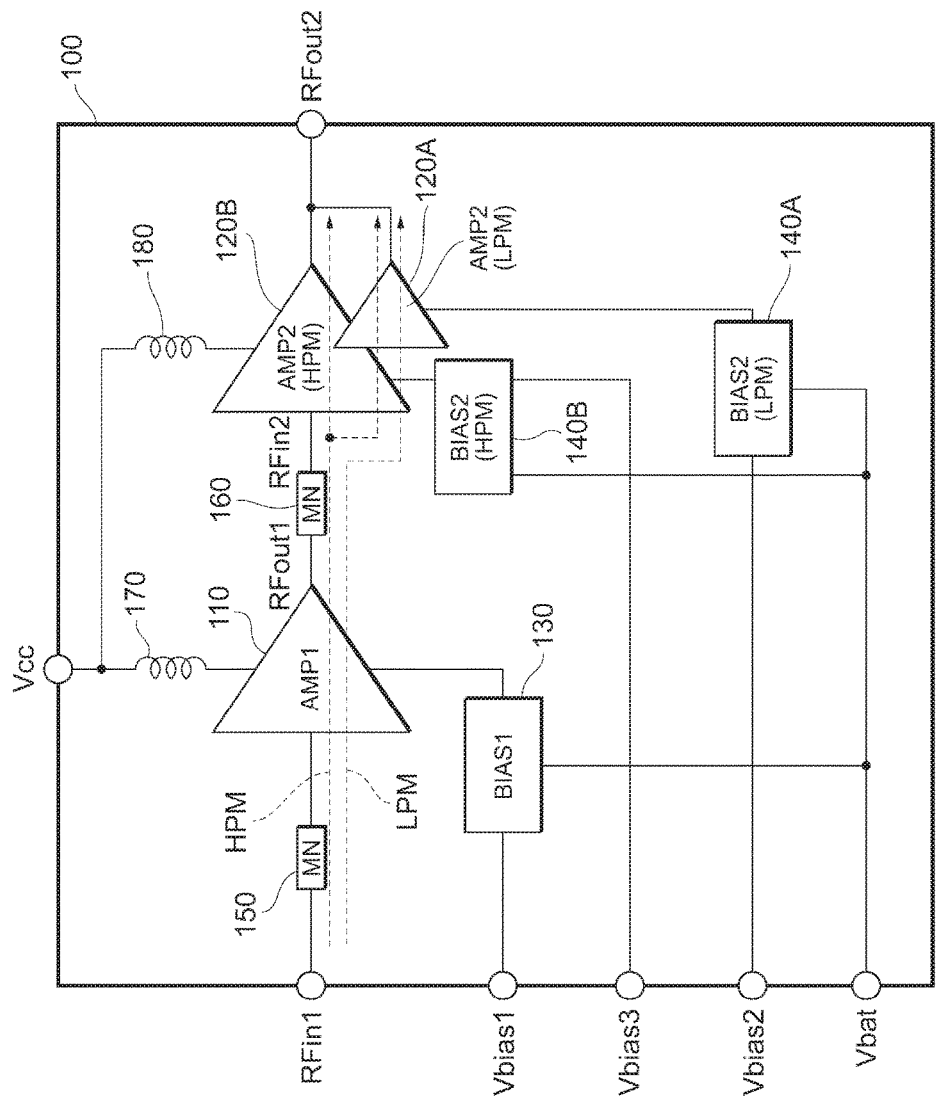
FIG. 1 illustrates an example of the configuration of a power amplifier circuit according to an embodiment of the present disclosure.

An embodiment of the present disclosure will be described below with reference to the accompanying drawings. FIG. 1 illustrates the configuration of a power amplifier circuit 100 according to an embodiment. The power amplifier circuit 100 is an integrated circuit used in a mobile communication device, such as a cellular phone, and for amplifying power of an RF signal to be transmitted to a base station.

As shown in FIG. 1, the power amplifier circuit 100 includes power amplifiers 110, 120A, and 120B, bias circuits 130, 140A, and 140B, matching circuits (matching networks (MN)) 150 and 160, and inductors 170 and 180.

The power amplifiers 110, 120A, and 120B form a two-stage amplifier circuit. A power supply voltage Vcc is supplied to the power amplifier 110 via the inductor 170 and is also supplied to the power amplifiers 120A and 120B via the inductor 180. The power amplifier 110 amplifies an RF signal RFin1 (third signal) and outputs an amplified signal RFout1 (first signal). The power amplifiers 120A and 120B amplify an RF signal RFin2 (RFout1) (first signal) and output an amplified signal RFout2 (second signal). The power amplifiers 120A and 120B are connected in parallel with each other. The power amplifier circuit 100 may be operated at a relatively low power level in a low power mode (LPM) (first power mode) and at a relatively high power level in a high power mode (HPM) (second power mode). The power amplifier 120A is turned ON in any one of the low power mode and the high power mode. The power amplifier 120B is turned OFF in the low power mode and is turned ON in the high power mode. In the low power mode, the power amplifier circuit 100 amplifies an RF signal by using the power amplifiers 110 and 120A. In the high power mode, the power amplifier circuit 100 amplifies an RF signal by using the power amplifiers 110, 120A, and 120B. The power amplifiers 120A and 120B include a bipolar transistor (for example, an HBT) constituted by plural unit transistors (also called fingers). The bipolar transistor includes, for example, sixteen unit transistors. The power amplifier 120A is constituted by four unit transistors, while the power amplifier 120B is constituted by twelve unit transistors. The number of unit transistors is not restricted to sixteen.

The bias circuits 130, 140A, and 140B supply a bias voltage or a bias current to the power amplifiers 110, 120A, and 120B, respectively. A battery voltage Vbat is supplied to the bias circuits 130, 140A, and 140B. The bias circuit 130 supplies a bias voltage or a bias current to the power amplifier 110 on the basis of a bias control voltage Vbias1. Similarly, the bias circuits 140A and 140B respectively supply a bias voltage or a bias current to the power amplifiers 120A and 120B on the basis of bias control voltages Vbias2 and Vbias3. In the low power mode, the bias circuit 140B does not supply a bias voltage or a bias current to the power amplifier 120B, which is thus turned OFF. The power amplifier 120B may be turned OFF by another approach. For example, the supply of a power supply voltage or a ground voltage to the power amplifier 120B may be stopped.

The matching circuits 150 and 160 are provided for performing impedance matching between circuits. The matching circuits 150 and 160 are constituted by, for example, inductors and capacitors.

Figure 2:
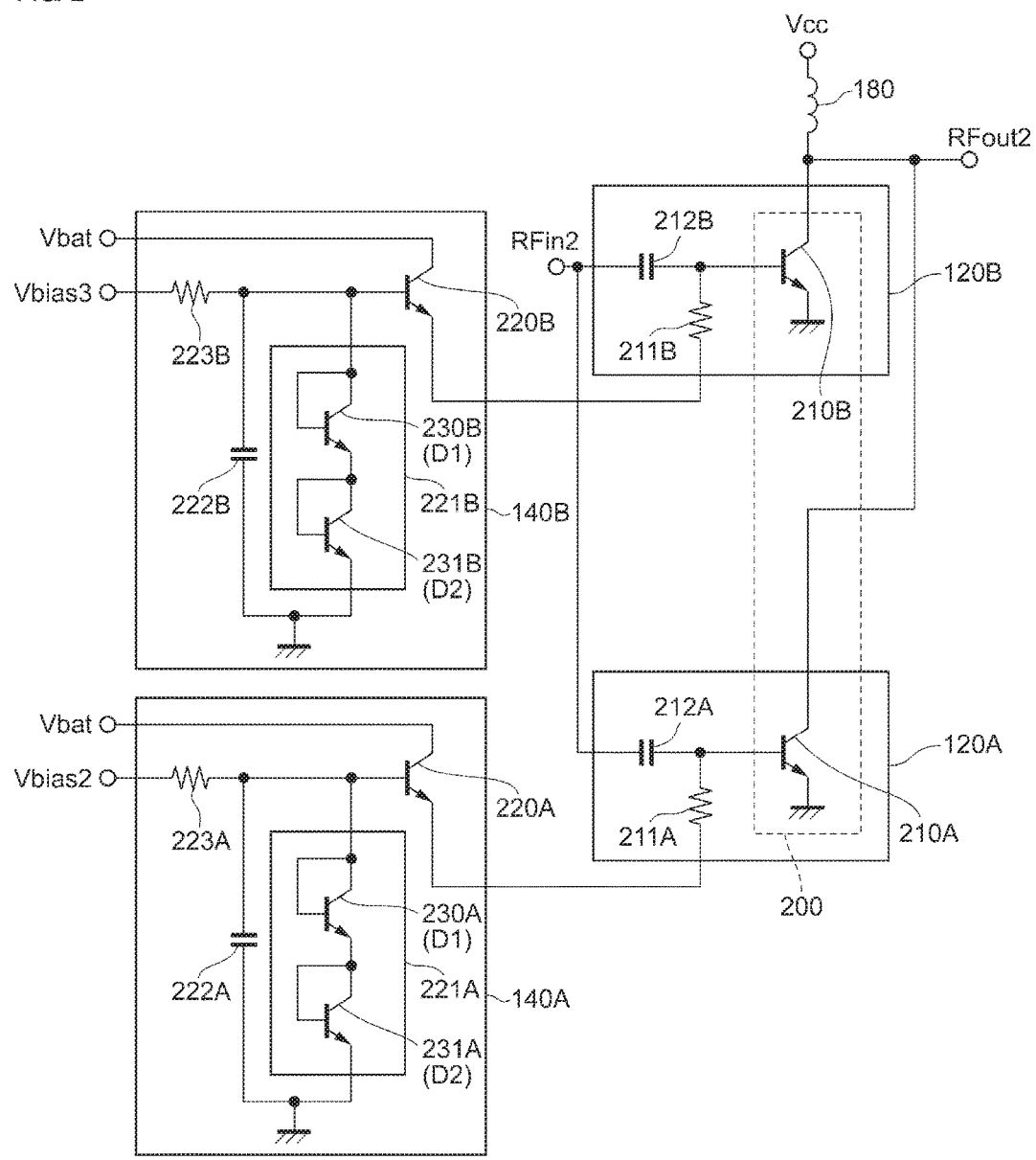
FIG. 2 illustrates an example of the configurations of power amplifiers and bias circuits.

FIG. 2 illustrates an example of the configurations of the power amplifiers 120A and 120B and the bias circuits 140A and 140B.

The power amplifiers 120A and 120B include a bipolar transistor 200 (first amplifier transistor) constituted by plural units transistors. The bipolar transistor 200 is constituted by a first group of plural (for example, four) unit transistors and a second group of plural (for example, twelve) unit transistors. The power amplifier 120A includes unit transistors 210A of the first group, resistors 211A, and capacitors 212A. The power amplifier 120B includes unit transistors 210B of the second group, resistors 211B, and capacitors 212B.

In the unit transistor 210A, the collector receives the power supply voltage Vcc via the inductor 180, the base receives the RF signal RFin2 via the capacitor 212A, and the emitter is grounded. A bias voltage or a bias current is supplied to the base of the unit transistor 210A via the resistor 211A. In the unit transistor 210B, the collector receives the power supply voltage Vcc via the inductor 180, the base receives the RF signal RFin2 via the capacitor 212B, and the emitter is grounded. A bias voltage or a bias current is supplied to the base of the unit transistor 210B via the resistor 211B. With this configuration, the amplified signal RFout2 is output from the collector of the bipolar transistor 200.

The bias circuit 140A includes a bipolar transistor 220A (for example, an HBT), a voltage supply circuit 221A, a capacitor 222A, and a resistor 223A.

In the bipolar transistor 220A (first bias transistor), the collector receives the battery voltage Vbat, the base receives a voltage (first voltage) from the voltage supply circuit 221A, and the emitter supplies a bias voltage (first bias voltage) or a bias current (first bias current) to the base of the unit transistor 210A via the resistor 211A.

The voltage supply circuit 221A (first voltage supply circuit) controls the base voltage of the bipolar transistor 220A on the basis of the bias control voltage Vbias2. The voltage supply circuit 221A includes diodes 230A and 231A (first and second diodes). The diodes 230A and 231A are connected in series with each other. The anode of the diode 230A is connected to the base of the bipolar transistor 220A, and the cathode of the diode 231A is grounded. The capacitor 222A is connected in parallel with the diodes 230A and 231A. The bias control voltage Vbias2 is supplied to the anode of the diode 230A via the resistor 223A. With the configuration of the voltage supply circuit 221A, a voltage (first voltage) corresponding to a forward voltage of the diodes 230A and 231A is generated in the anode of the diode 230A, and this voltage is supplied to the base of the bipolar transistor 220A. Due to the characteristics of the forward voltage of the diodes 230A and 231A, the voltage generated in the anode of the diode 230A decreases in accordance with a temperature rise. The capacitor 222A is provided for stabilizing the voltage supplied from the voltage supply circuit 221A. The diodes 230A and 231A of the voltage supply circuit 221A will also be indicated by D1 and D2, respectively. The diodes 230A and 231A may be each constituted by a diode-connected bipolar transistor. Although in the example shown in FIG. 2 the voltage supply circuit 221A is constituted by diodes, the elements forming the voltage supply circuit 221A are not restricted to diodes.

The bias circuit 140B includes a bipolar transistor 220B (for example, an HBT), a voltage supply circuit 221B, a capacitor 222B, and a resistor 223B.

In the bipolar transistor 220B (second bias transistor), the collector receives the battery voltage Vbat, the base receives a voltage (second voltage) from the voltage supply circuit 221B, and the emitter supplies a bias voltage (second bias voltage) or a bias current (second bias current) to the base of the unit transistor 210B via the resistor 211B.

The voltage supply circuit 221B (second voltage supply circuit) controls the base voltage of the bipolar transistor 220B on the basis of the bias control voltage Vbias3. The voltage supply circuit 221B includes diodes 230B and 231B (third and fourth diodes). The diodes 230B and 231B are connected in series with each other. The anode of the diode 230B is connected to the base of the bipolar transistor 220B, and the cathode of the diode 231B is grounded. The capacitor 222B is connected in parallel with the diodes 230B and 231B. The bias control voltage Vbias3 is supplied to the anode of the diode 230B via the resistor 223B. With the configuration of the voltage supply circuit 221B, a voltage (second voltage) corresponding to a forward voltage of the diodes 230B and 231B is generated in the anode of the diode 230B, and this voltage is supplied to the base of the bipolar transistor 220B. Due to the characteristics of the forward voltage of the diodes 230B and 231B, the voltage generated in the anode of the diode 230B decreases in accordance with a temperature rise. The capacitor 222B is provided for stabilizing the voltage supplied from the voltage supply circuit 221B. The diodes 230B and 231B of the voltage supply circuit 221B will also be indicated by D1 and D2, respectively. The diodes 230B and 231B may be each constituted by a diode-connected bipolar transistor. Although in the example shown in FIG. 2 the voltage supply circuit 221B is constituted by diodes, the elements forming the voltage supply circuit 221B are not restricted to diodes.

The configuration of the power amplifier 110 is similar to that of the power amplifiers 120A and 120B shown in FIG. 2, and the configuration of the bias circuit 130 is similar to that of the bias circuits 140A and 140B shown in FIG. 2. That is, as well as the power amplifiers 120A and 120B, the power amplifier 110 includes a bipolar transistor (second amplifier transistor) as the amplifier element.

Figure 3A:
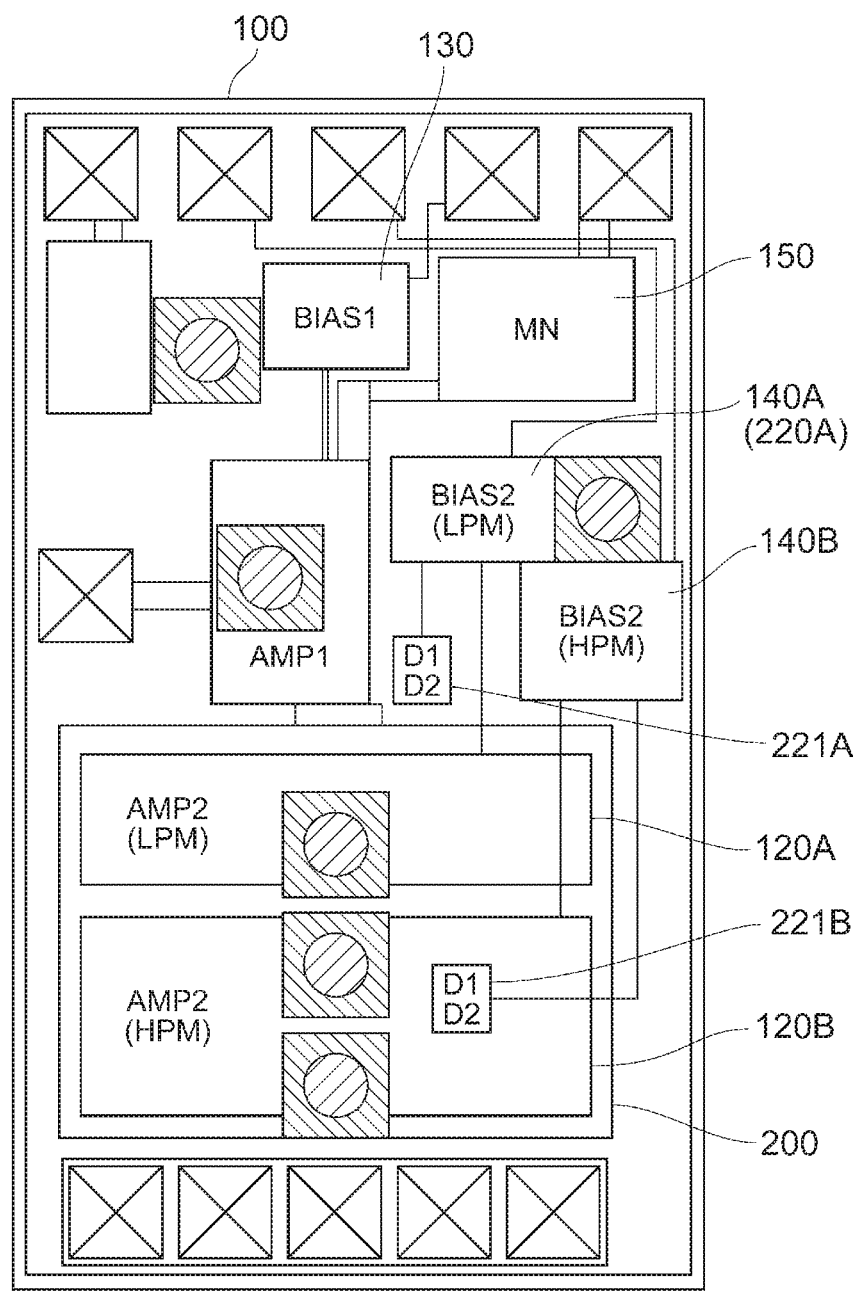
FIG. 3A illustrates an example of the layout of the power amplifier circuit.

FIG. 3A illustrates an example of the layout of the power amplifier circuit 100. The layout shown in FIG. 3A does not illustrate the configuration of all the elements of the power amplifier circuit 100, but only schematically illustrates the configuration of the power amplifier circuit 100.

As shown in FIG. 3A, the voltage supply circuit 221A forming the bias circuit 140A is disposed outside a substantially rectangular region where the bipolar transistor 200 is formed. In contrast, the voltage supply circuit 221B forming the bias circuit 140B is disposed within this substantially rectangular region. The power amplifier 120A is disposed in a region (first sub-region) which does not include the central portion of the substantially rectangular region where the bipolar transistor 200 is formed. The central portion of the substantially rectangular region is an intersection of two diagonal lines in the substantially rectangular region. In contrast, the power amplifier 120B is disposed in a region (second sub-region) which includes the central portion of the substantially rectangular region where the bipolar transistor 200 is formed. The power amplifier 120A is disposed in a region which does not include the central portion of the substantially rectangular region which means that part of the bipolar transistor 200 forming the power amplifier 120A is not disposed at the central portion of the substantially rectangular region. The power amplifier 120B is disposed in a region which includes the central portion of the substantially rectangular region which means that part of the bipolar transistor 200 forming the power amplifier 120B is disposed at the central portion of the substantially rectangular region.

Details of the positions at which the power amplifiers 120A and 120B are disposed will be discussed later.

The temperature of the bipolar transistor 200 rises in accordance with its operation. The temperature rise is noticeable particularly when the bipolar transistor 200 operates in the high power mode. This temperature rise increases the collector current in the bipolar transistor 200, and the increased collector current raises the temperature of the bipolar transistor 200 again. This may cause the occurrence of thermal runaway. In the power amplifier circuit 100, the voltage supply circuits 221A and 221B contribute to suppressing the occurrence of thermal runaway.

A rise in the temperature of the bipolar transistor 200 increases the temperature of the voltage supply circuit 221B. This decreases the forward voltage of the diodes 230B and 231B and further decreases the voltage supplied to the base of the bipolar transistor 220B. This decreases the bias voltage or the bias current supplied to the power amplifier 120B. As a result, a temperature rise in the bipolar transistor 200 is suppressed. Decreasing of the forward voltage of the diodes 230B and 231B by heat is called thermal coupling between the amplifier and the voltage supply circuit.

Regarding the temperature distribution in the bipolar transistor 200, without the control performed by the voltage supply circuits 221A and 221B, the temperature at and around the center of the transistor element becomes high, while the temperature at and near the periphery thereof becomes low. That is, in the bipolar transistor 200, the temperature of the power amplifier 120A becomes relatively low. In this embodiment, the voltage supply circuit 221B is disposed within the substantially rectangular region where the bipolar transistor 200 is formed, while the voltage supply circuit 221A is disposed outside this substantially rectangular region. According to this layout, the temperature of the voltage supply circuit 221A becomes lower than that of the voltage supply circuit 221B. Consequently, the bias voltage or the bias current supplied to the power amplifier 120A is not decreased as much as that to the power amplifier 120B. This suppresses a temperature decrease in the region where the power amplifier 120A is disposed. As a result, the uniformity of the temperature distribution in the overall bipolar transistor 200 can be improved.

It is preferable that the voltage supply circuit 221A be disposed in a region adjacent to the substantially rectangular region where the bipolar transistor 200 is formed. In the layout shown in FIG. 3A, for example, the voltage supply circuit 221A is formed between the outer periphery of the substantially rectangular region where the bipolar transistor 200 is formed and the bipolar transistor 220A of the bias circuit 140A. The temperature of the region adjacent to the substantially rectangular region where the bipolar transistor 200 is formed is increased in accordance with a temperature rise in the bipolar transistor 200, though it is lower than that of the substantially rectangular region. The temperature of the voltage supply circuit 221A is increased accordingly, which further decreases the bias voltage or the bias current supplied to the power amplifier 120A. As a result, the occurrence of thermal runaway can be suppressed.

Figure 3B:
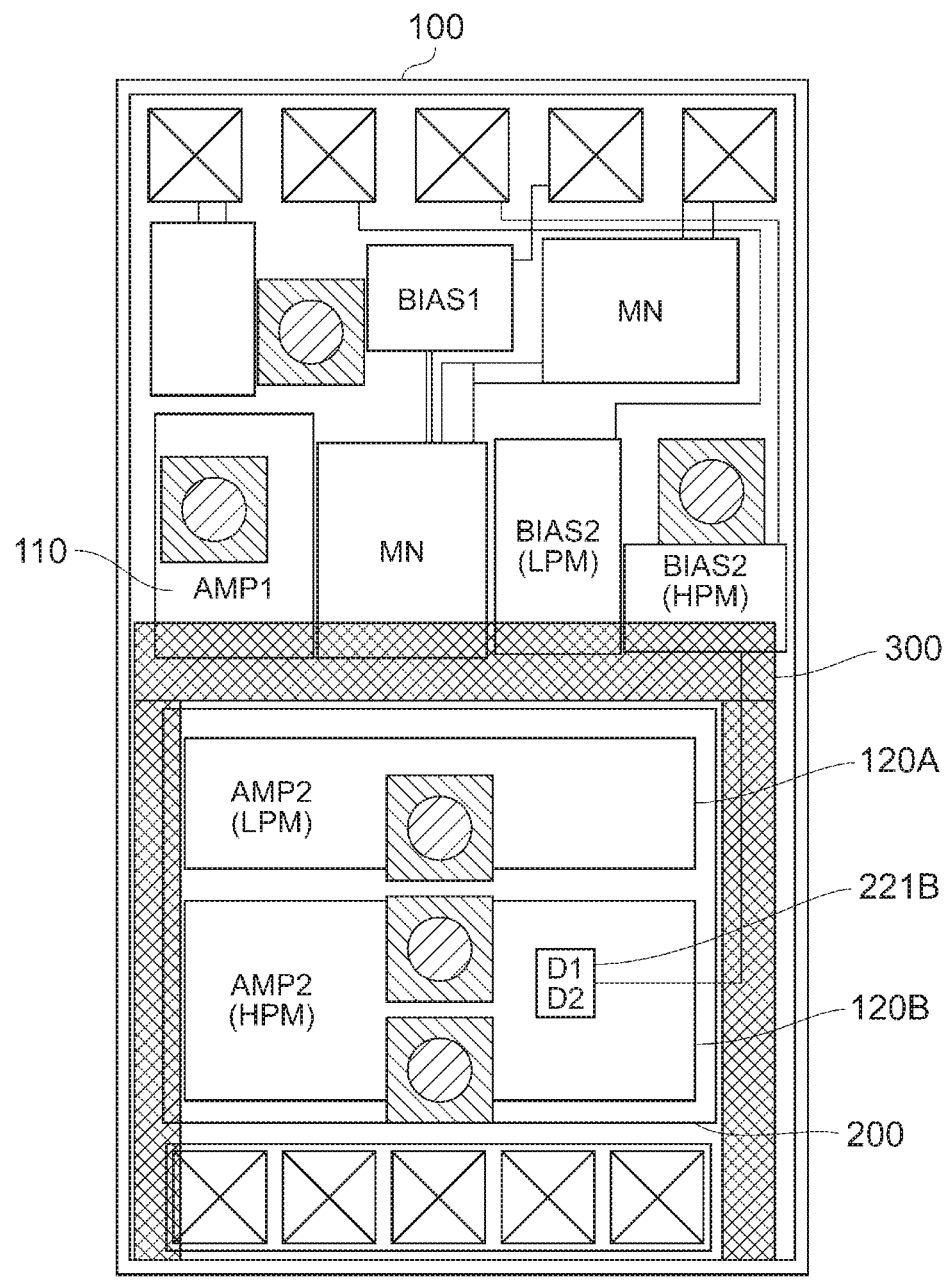
FIG. 3B illustrates another example of the layout of the power amplifier circuit.

The region where the voltage supply circuit 221A is disposed is not restricted to that shown in FIG. 3A. The voltage supply circuit 221A may be disposed at any region adjacent to the substantially rectangular region where the bipolar transistor 200 is formed. As shown in FIG. 3B, for example, the voltage supply circuit 221A may be disposed in a region 300 between the outer periphery of the substantially rectangular region where the bipolar transistor 200 is formed and another element such as the power amplifier 110.

Figure 3C:
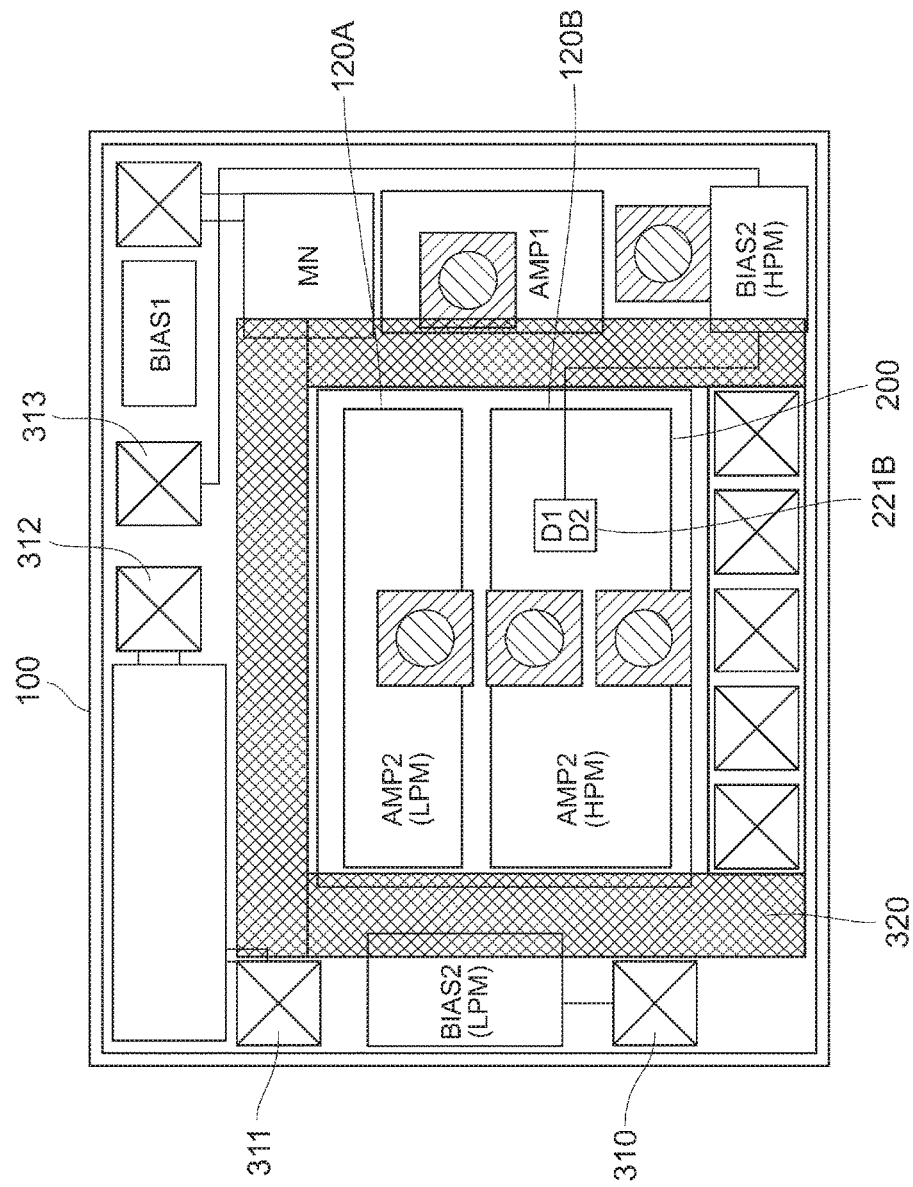
FIG. 3C illustrates still another example of the layout of the power amplifier circuit.

As shown in FIG. 3C, for example, the voltage supply circuit 221A may be disposed in a region 320 between the outer periphery of the substantially rectangular region where the bipolar transistor 200 is formed and wire-bonding terminals 310 through 313. Alternatively, the voltage supply circuit 221A may not necessarily be disposed in a region adjacent to the substantially rectangular region where the bipolar transistor 200 is formed. For example, another element may be disposed between the substantially rectangular region where the bipolar transistor 200 is formed and the voltage supply circuit 221A.

Figure 4:
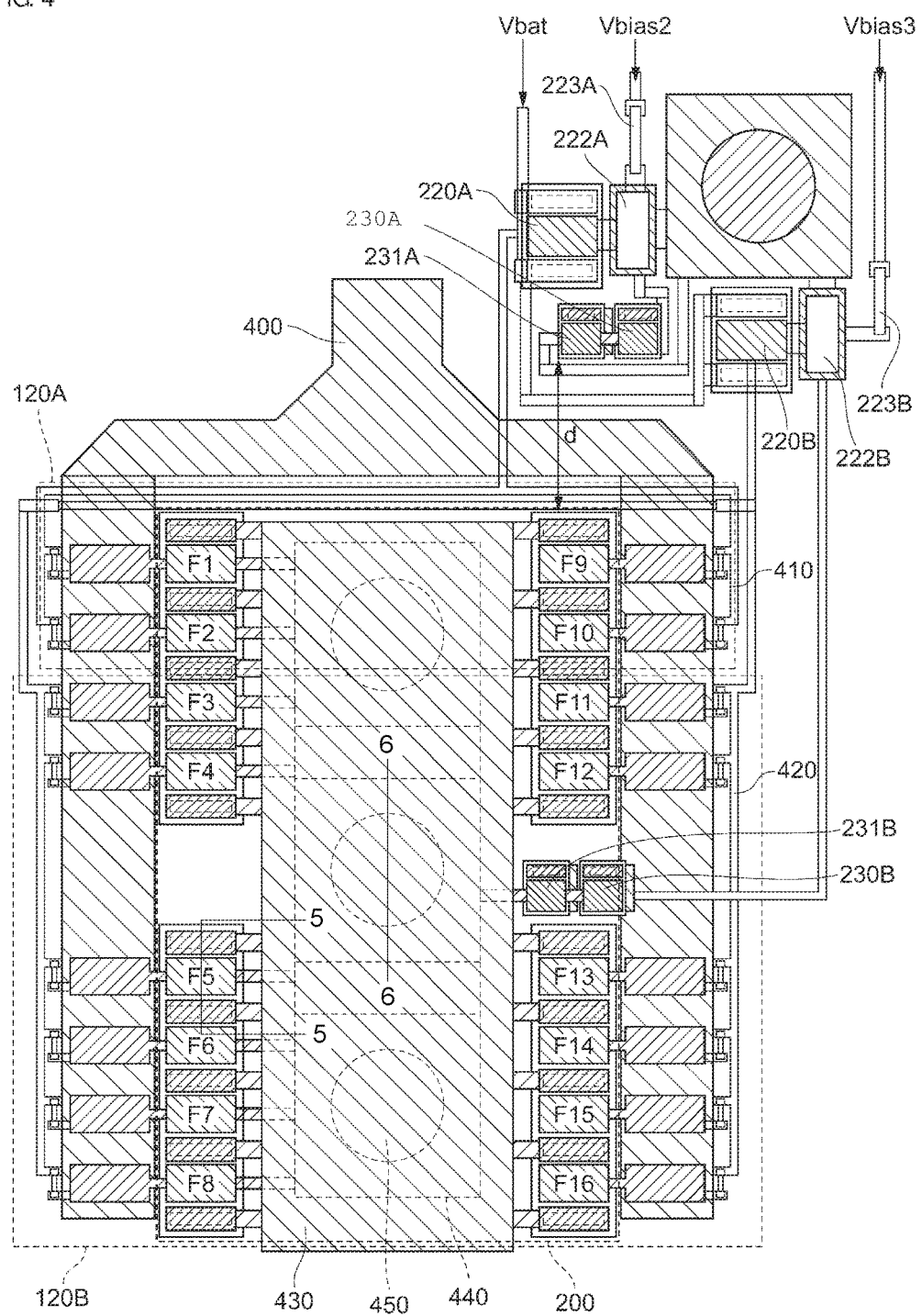
FIG. 4 illustrates details of an example of the layout of the power amplifiers and the bias circuits.

FIG. 4 illustrates details of an example of the layout of the power amplifiers 120A and 120B and the bias circuits 140A and 140B.

In FIG. 4, sixteen unit transistors (fingers) F1 through F16 forming the bipolar transistor 200 are shown. The sixteen unit transistors are aligned in two rows (F1 through F8 and F9 through F16). The power amplifier 120A includes four unit transistors F1, F2, F9, and F10. The power amplifier 120B includes twelve unit transistors F3 through F8 and F11 through F16. The unit transistors F1, F2, F9, and F10 are disposed in a region (first sub-region) which does not include the central portion of the substantially rectangular region where the bipolar transistor 200 is formed. The unit transistors F3 through F8 and F11 through F16 are disposed in a region (second sub-region) which includes the central portion of this substantially rectangular region.

The RF signal RFin2 is supplied to the base of each unit transistor via RF input wiring 400. A bias voltage or a bias current is supplied to the base of each of the unit transistors F1, F2, F9, and F10 of the power amplifier 120A from the bipolar transistor 220A via wiring 410. A bias voltage or a bias current is supplied to the base of each of the unit transistors F3 through F8 and F11 through F16 of the power amplifier 120B from the bipolar transistor 220B via wiring 420. The collector of each unit transistor is connected to collector wiring 430. The emitter of each unit transistor is connected to emitter wiring 440 and is grounded through a via-hole 450. The number of unit transistors is not restricted to sixteen, and the number of rows of the unit transistors is not restricted to two.

As described above, the voltage supply circuit 221A (diodes 230A and 231A) is disposed outside the substantially rectangular region where the bipolar transistor 200 is formed. More specifically, the voltage supply circuit 221A (diodes 230A and 231A) is disposed at a position at which it is separated from the outer periphery of this substantially rectangular region by a distance d. The voltage supply circuit 221B (diodes 230B and 231B) is disposed within this substantially rectangular region. According to this layout, it is possible to improve the uniformity of the temperature distribution in the bipolar transistor 200, as discussed above.

As shown in FIG. 4, the unit transistors F1 through F8 on the side on which the voltage supply circuit 221A is not disposed may be arranged substantially symmetrically with the unit transistors F9 through F16 on the side on which the voltage supply circuit 221A is disposed. With this arrangement, the unit transistors F1 through F16, which are heat sources, are disposed substantially symmetrically with respect to the center of the substantially rectangular region where the bipolar transistor 200 is formed. This further contributes to an improvement in the uniformity of the temperature distribution in the bipolar transistor 200. Unit transistors disposed in three or more rows may be arranged in a similar manner.

Another element may be disposed in a space within the substantially rectangular region where the bipolar transistor 200 is formed. For example, a protective element may be disposed between the unit transistors F4 and F5. Forming of another element within the substantially rectangular region reduces the chip size of the power amplifier circuit 100.

Figure 5:
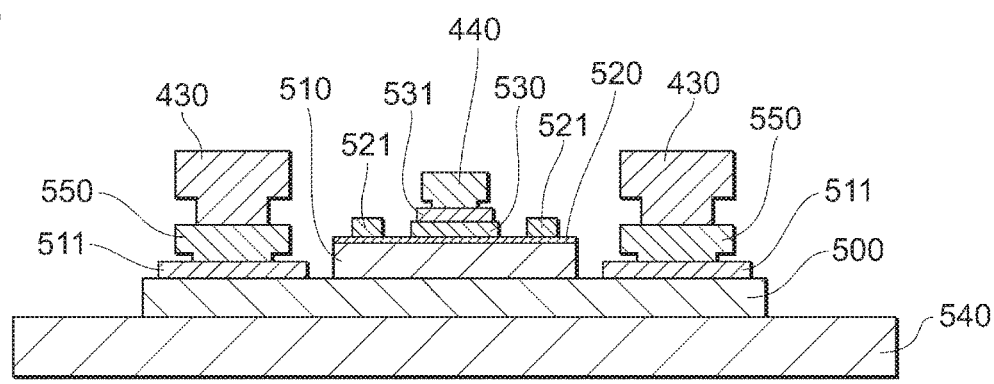
FIG. 5 illustrates an example of a cross section taken along line 5-5 in FIG. 4.

FIG. 5 illustrates an example of a cross section of a unit transistor taken along line 5-5 in FIG. 4. The unit transistor includes a sub-collector 500, a collector 510, collector electrodes 511, a base 520, base electrodes 521, an emitter 530, and an emitter electrode 531.

The sub-collector 500 is formed on, for example, a gallium arsenide (GaAs) substrate 540. The collector 510 and the collector electrodes 511 are formed on the sub-collector 500. The base 520 is formed on the collector 510. The base electrodes 521 are formed on the base 520. Collector wiring 550 and the collector wiring 430 shown in FIG. 4 are laid on the collector electrodes 511. The emitter electrode 531 is formed on the emitter 530. The emitter wiring 440 shown in FIG. 4 is laid on the emitter electrode 531.

Figure 6:
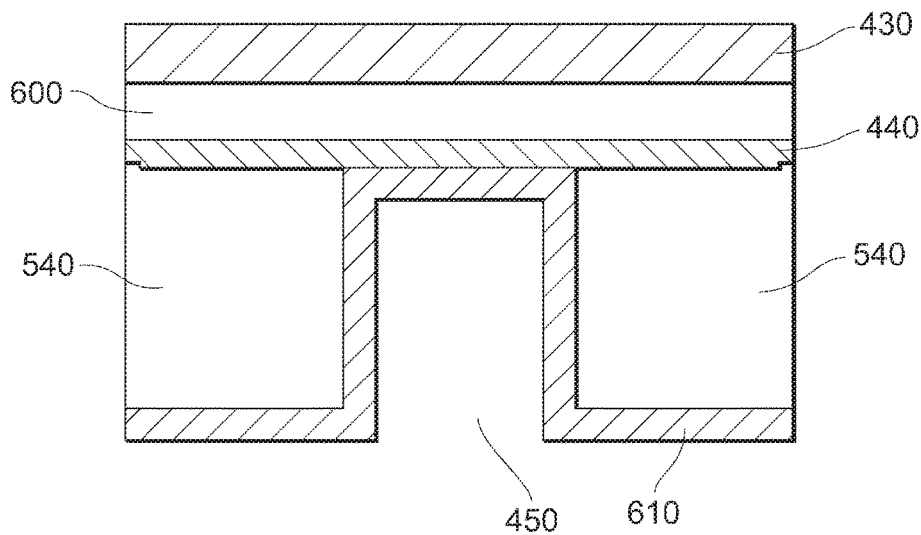
FIG. 6 illustrates an example of a cross section taken along line 6-6 in FIG. 4.

FIG. 6 illustrates an example of a cross section taken along line 6-6 in FIG. 4. The emitter wiring 440 is formed on the front surface of the substrate 540. An insulating resin film 600 is formed on the emitter wiring 440. The collector wiring 430 is formed on the insulating resin film 600. The via-hole 450 is formed from the back surface of the substrate 540 until the emitter wiring 440. Wiring 610 to be connected to a ground is formed in the via-hole 450.

Figure 7:
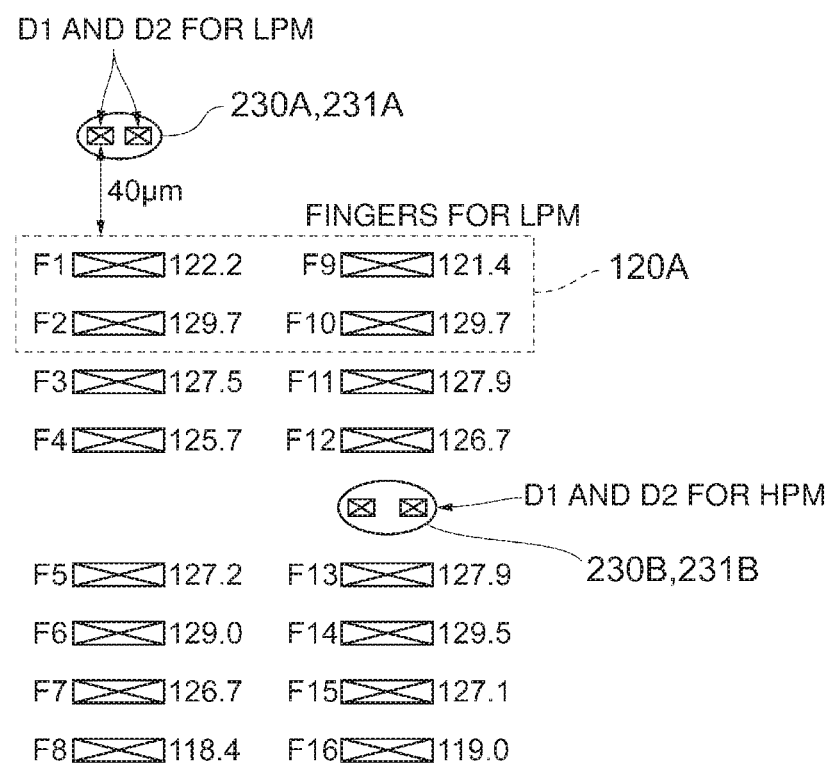
FIGS. 7 and 8 illustrate an example of simulation results of the temperature distribution in the power amplifier circuit.
Figure 8:
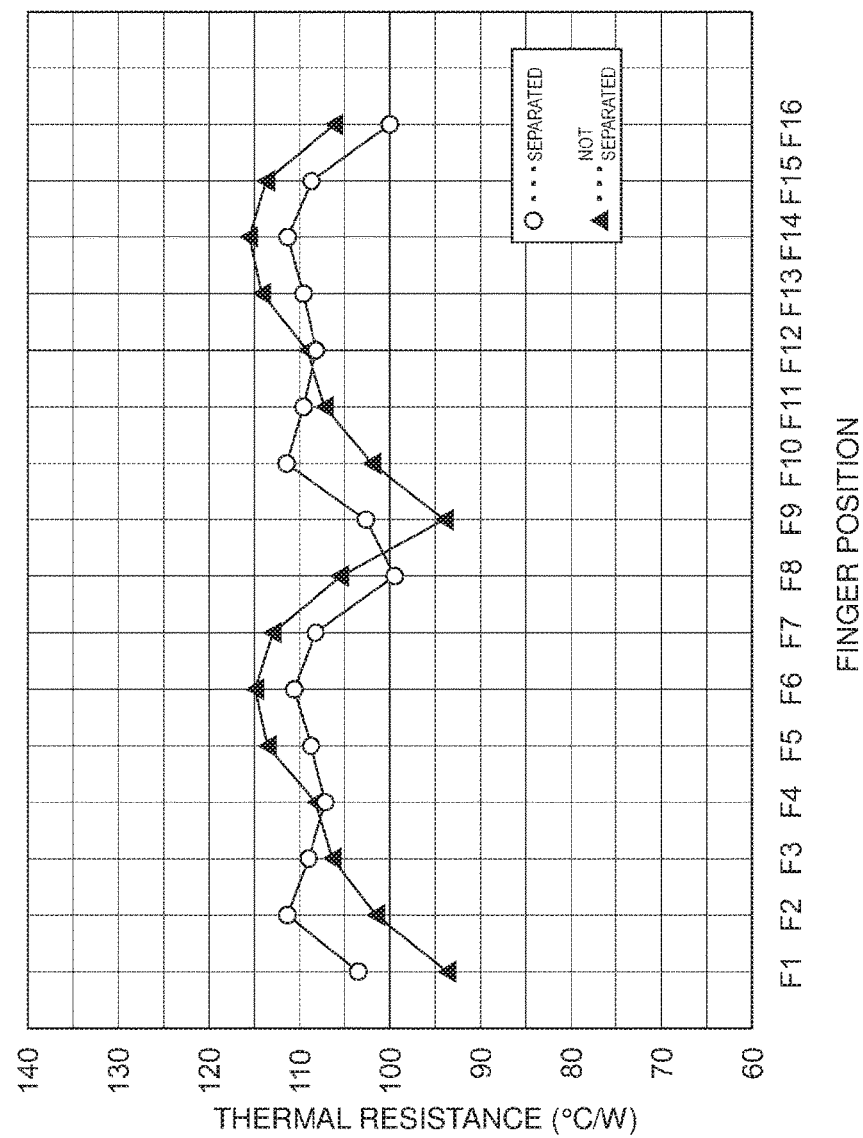

FIGS. 7 and 8 illustrate an example of the simulation results of the temperature distribution in the power amplifier circuit 100.

FIG. 7 illustrates the temperatures of unit transistors. As shown in FIG. 7, sixteen unit transistors (F1 through F16) are arranged in two rows (F1 through F8 and F9 through F16). Among the sixteen unit transistors F1 through F16, the unit transistors F1, F2, F9, and F10 are used for the power amplifier 120A. The voltage supply circuit 221A (diodes 230A and 231A) is disposed at a position at which it is separated by about 40 µm from the outer periphery of the substantially rectangular region where the bipolar transistor 200 is formed. The voltage supply circuit 221B (diodes 230B and 231B) is disposed near the central portion of the substantially rectangular region (between the unit transistors F12 and F13).

In FIG. 7, the temperatures of the unit transistors when the power amplifier circuit 100 is operated in the high power mode (at a room temperature of about 25 degrees) are shown. FIG. 7 shows that the temperatures of the unit transistors F1, F2, F9, and F10 are roughly the same as those of the unit transistors disposed near the central portion of the substantially rectangular region (for example, unit transistors F4, F5, F12, and F13).

FIG. 8 shows a graph representing the thermal resistance of the unit transistors. The horizontal axis indicates the position of the unit transistor, while the vertical axis indicates the thermal resistance (° C./W). In FIG. 8, the line chart indicated by "separated" represents the simulation results of the power amplifier circuit 100. In FIG. 8, the line chart indicated by "not separated" represents the simulation results of a comparative example in which, as well as the voltage supply circuit 221B (diodes 230B and 231B), the voltage supply circuit 221A (diodes 230A and 231A) is disposed within the substantially rectangular region where the bipolar transistor 200 is formed. FIG. 8 shows that the variations in the thermal resistance of the unit transistors F1 through F16 of the power amplifier circuit 100 are smaller than those of the comparative example.

Figure 9:
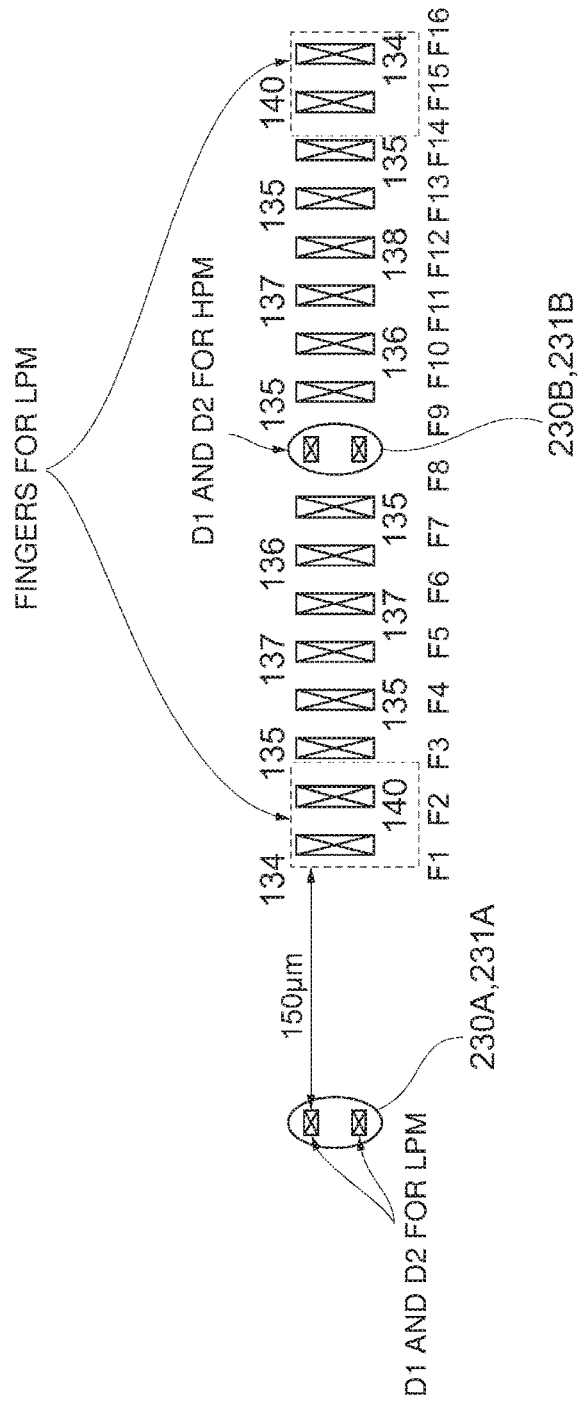
FIG. 9 illustrates another example of simulation results of the temperature distribution in the power amplifier circuit.

FIG. 9 illustrates another example of the simulation results of the temperature distribution in the power amplifier circuit 100. In FIG. 9, the temperatures of the unit transistors when the power amplifier circuit 100 is operated in the high power mode (at a room temperature of about 25 degrees) are shown. In FIG. 9, sixteen unit transistors F1 through F16 are arranged in one row. Among the sixteen unit transistors F1 through F16, the unit transistors F1, F2, F15, and F16 are used for the power amplifier 120A. The voltage supply circuit 221A (diodes 230A and 231A) is disposed at a position at which it is separated by about 150 μm from the outer periphery of the substantially rectangular region where the bipolar transistor 200 is formed. The voltage supply circuit 221B (diodes 230B and 231B) is disposed near the central portion of the substantially rectangular region (between the unit transistors F8 and F9). In this example, as well as in the example shown in FIG. 7, the temperatures of the unit transistors F1, F2, F15, and F16 are roughly the same as those of the unit transistors disposed near the central portion of the substantially rectangular region (for example, unit transistors F8 and F9).

Figure 10:
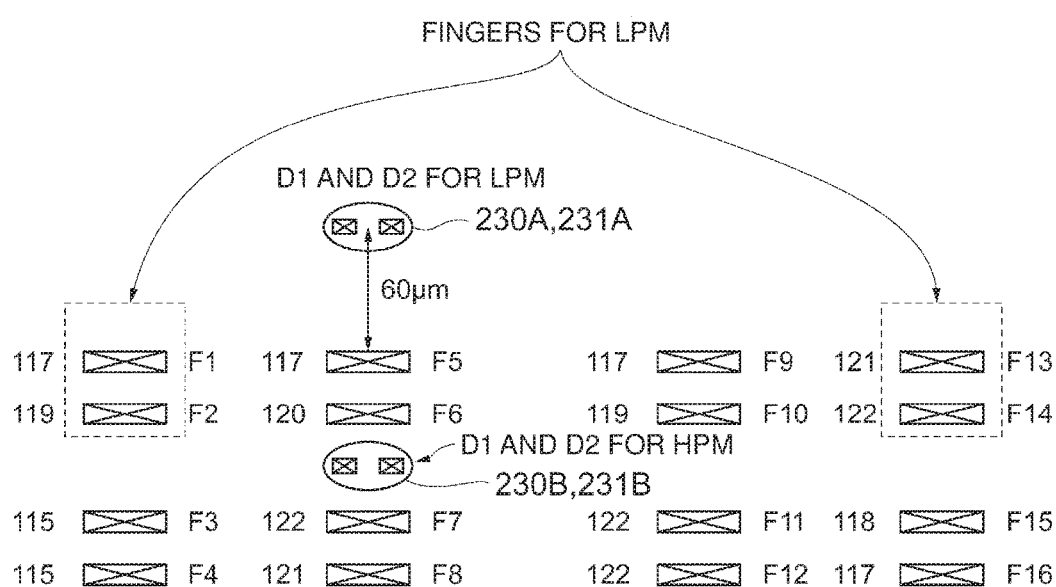
FIG. 10 illustrates still another example of simulation results of the temperature distribution in the power amplifier circuit.

FIG. 10 illustrates another example of the simulation results of the temperature distribution in the power amplifier circuit 100. In FIG. 10, the temperatures of the unit transistors when the power amplifier circuit 100 is operated in the high power mode (at a room temperature of about 25 degrees) are shown. In FIG. 10, sixteen unit transistors (F1 through F16) are arranged in four rows (F1 through F4, F5 through F8, F9 through F12, and F13 through F16). Among the sixteen unit transistors F1 through F16, the unit transistors F1, F2, F13, and F14 are used for the power amplifier 120A. The voltage supply circuit 221A (diodes 230A and 231A) is disposed at a position at which it is separated by about 60 μm from the outer periphery of the substantially rectangular region where the bipolar transistor 200 is formed. The voltage supply circuit 221B (diodes 230B and 231B) is disposed near the central portion of the substantially rectangular region (between the unit transistors F6 and F7). In this example, as well as in the examples shown in FIGS. 7 and 9, the temperatures of the unit transistors F1, F2, F13, and F14 are roughly the same as those of the unit transistors disposed near the central portion of the substantially rectangular region (for example, unit transistors F6, F7, F10, and F11).

Figure 11:
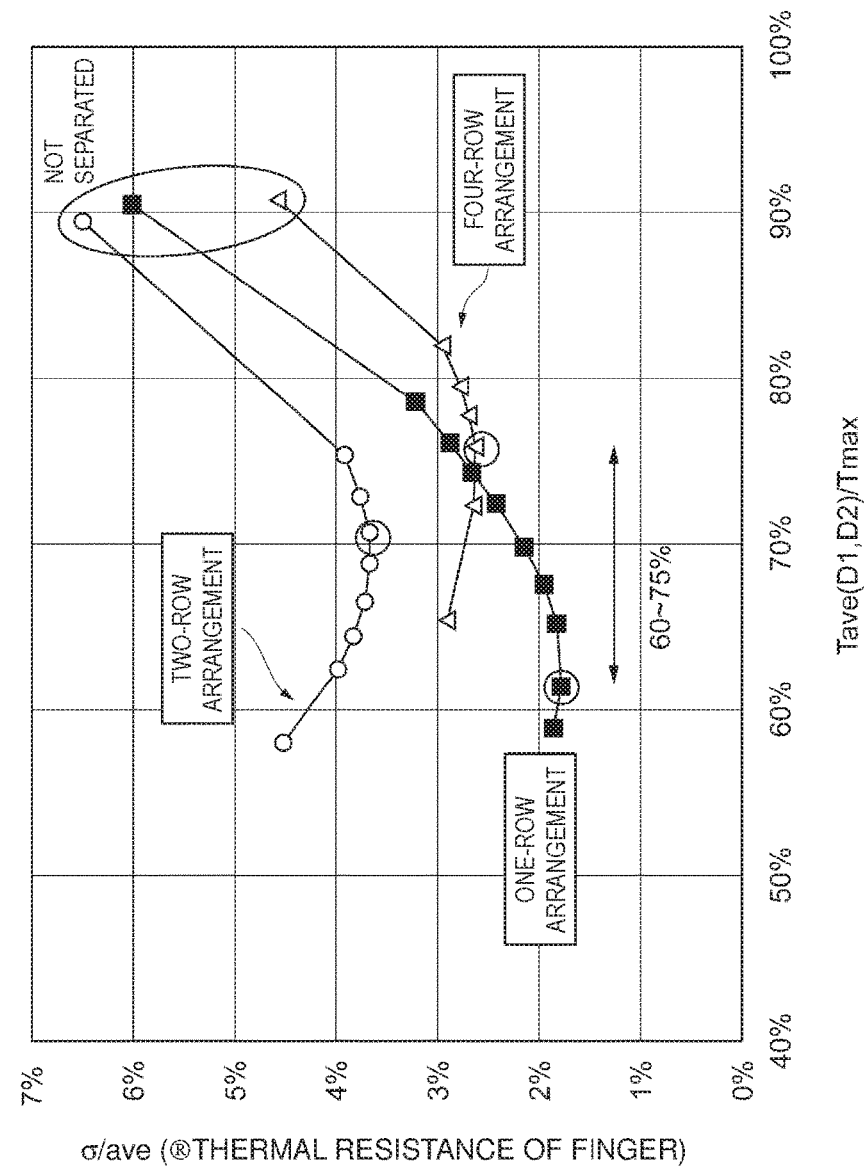
FIG. 11 shows a graph illustrating an example of simulation results obtained from unit transistors arranged as shown in FIGS. 7, 9, and 10 in accordance with the position of a voltage supply circuit.

FIG. 11 shows a graph illustrating an example of the simulation results obtained from the unit transistors arranged in two rows, those arranged in one row, and those arranged in four rows shown in FIGS. 7, 9, and 10, respectively, in accordance with the position of the voltage supply circuit 221A (diodes 230A and 231A).

In FIG. 11, the horizontal axis indicates the ratio (%) of the temperature (Tave (D1,D2)) at the position at which the voltage supply circuit 221A (diodes 230A and 231A) is disposed to the maximum temperature Tmax in the substantially rectangular region where the bipolar transistor 200 is formed. The vertical axis indicates the ratio (%) of the standard deviation (σ) of the thermal resistance of the unit transistors to the average (ave) of the thermal resistance of the unit transistors. In FIG. 11, data representing the temperature ratio around 90% on the horizontal axis indicates the simulation results of a comparative example ("not separated"), as in FIG. 8.

The simulation results in FIG. 11 show that the variations in the thermal resistance of the unit transistors arranged in two rows, those in one row, and those in four rows are all smaller than those of the comparative example, that is, the uniformity of the temperature distribution in the unit transistors is improved. In the range of the temperature ratio of about 60 to 75% on the horizontal axis, the variations in the thermal resistance are particularly small.

Figure 12:
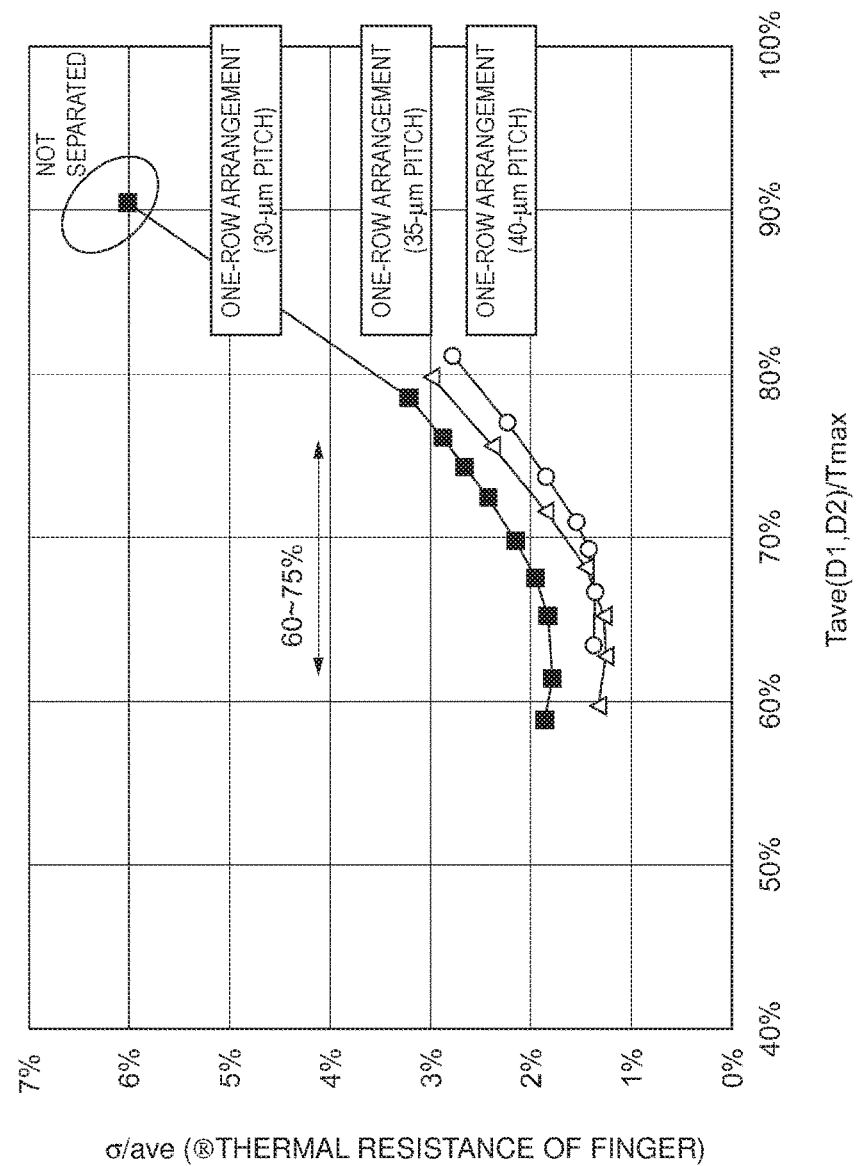
FIG. 12 shows a graph illustrating an example of simulation results obtained by varying the distance (pitch) between the unit transistors arranged shown in FIG. 9.

FIG. 12 shows a graph illustrating an example of the simulation results obtained by varying the distance (pitch) between the unit transistors arranged in one row shown in FIG. 9. In FIG. 12, the horizontal axis indicates the temperature ratio and the vertical axis indicates the ratio of the standard deviation, as in FIG. 11. In FIG. 12, the simulation results obtained by varying the pitch between the unit transistors to about 30 μm, 35 μm, and 40 μm are shown. Regardless of the pitch between the unit transistors, the variations in the thermal resistance are particularly small in the range of the temperature ratio of about 60 to 75% on the horizontal axis.

The exemplary embodiment has been discussed. In the power amplifier circuit 100, the unit transistors 210A of the first group forming the power amplifier 120A are disposed in a region (first sub-region) which does not include the central portion of the substantially rectangular region where the bipolar transistor 200 is formed. In contrast, the unit transistors 210B of the second group forming the power amplifier 120B are disposed in a region (second sub-region) which includes the central portion of the substantially rectangular region where the bipolar transistor 200 is formed. The voltage supply circuit 221A, which controls a bias voltage or a bias current to be supplied to the power amplifier 120A, is disposed outside the substantially rectangular region where the bipolar transistor 200 is formed. In contrast, the voltage supply circuit 221B, which controls a bias voltage or a bias current to be supplied to the power amplifier 120B, is disposed within this substantially rectangular region.

According to this layout, the temperature of the voltage supply circuit 221A becomes lower than that of the voltage supply circuit 221B. Consequently, the bias voltage or the bias current supplied to the power amplifier 120A is not decreased as much as that to the power amplifier 120B. This suppresses a temperature decrease in the region where the power amplifier 120A is disposed (the region which does not include the central portion of the substantially rectangular region where the bipolar transistor 200 is formed). As a result, the uniformity of the temperature distribution in the bipolar transistor 200 can be improved.

In the power amplifier circuit 100, the voltage supply circuit 221B is disposed in a region (second sub-region) which includes the central portion of the substantially rectangular region where the bipolar transistor 200 is formed. The temperature of the bipolar transistor 200, in particular, the central portion, is likely to become high. Forming of the voltage supply circuit 221B near the central portion of the substantially rectangular region enhances the effect of suppressing the occurrence of thermal runaway in the bipolar transistor 200.

In the power amplifier circuit 100, the number of unit transistors (fingers) forming the power amplifier 120A is smaller than that of the power amplifier 120B. Thus, fewer unit transistors (fingers) benefit from the effect of suppressing a temperature decrease. To put it another way, it is easy to maintain the effect of suppressing the occurrence of thermal runaway in the overall bipolar transistor 200.

In the power amplifier circuit 100, the voltage supply circuit 221A is disposed in a region adjacent to the substantially rectangular region where the bipolar transistor 200 is formed. The temperature of the region adjacent to this substantially rectangular region is increased in accordance with a temperature rise in the bipolar transistor 200, though it is lower than that of the substantially rectangular region.

The temperature of the voltage supply circuit 221A is increased accordingly, which further decreases the bias voltage or the bias current supplied to the power amplifier 120A. As a result, the occurrence of thermal runaway can be suppressed.

As shown in FIG. 3A, for example, the voltage supply circuit 221A may be disposed between the outer periphery of the substantially rectangular region where the bipolar transistor 200 is formed and the bipolar transistor 220A of the bias circuit 140A.

As shown in FIG. 3B, for example, the voltage supply circuit 221A may be disposed in the region 300 between the outer periphery of the substantially rectangular region where the bipolar transistor 200 is formed and another element such as the power amplifier 110.

As shown in FIG. 3C, for example, the voltage supply circuit 221A may be disposed in the region 320 between the outer periphery of the substantially rectangular region where the bipolar transistor 200 is formed and wire-bonding terminals 310 through 313.

As shown in FIGS. 11 and 12, the voltage supply circuit 221A may be disposed at a position at which the temperature of the voltage supply circuit 221A will be about 60 to 75% of the maximum temperature in the substantially rectangular region where the bipolar transistor 200 is formed. This further increases the uniformity of the temperature distribution.

In the power amplifier circuit 100, the voltage supply circuit 221A may be constituted by the series-connected diodes 230A and 231A. Similarly, the voltage supply circuit 221B may be constituted by the series-connected diodes 230B and 231B. With this configuration, the occurrence of thermal runaway can be suppressed without the need to use a high resistance resistor.

The above-described preferred embodiment is provided for facilitating the understanding of the disclosure, but is not intended to be exhaustive or to limit the disclosure to the precise forms disclosed. Modifications and/or improvements may be made to the disclosure without departing from the scope and spirit of the disclosure, and equivalents of the disclosure are also encompassed in the disclosure. That is, suitable design changes made to the preferred embodiment by those skilled in the art are also encompassed in the disclosure within the scope and spirit of the disclosure. For example, the elements of the preferred embodiment and the positions, materials, conditions, configurations, and sizes thereof are not restricted to those described in the embodiment and may be changed in an appropriate manner. The elements of the preferred embodiment may be combined within a technically possible range, and configurations obtained by combining the elements of the embodiment are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
    a first amplifier transistor that amplifies a first signal inputted into an input terminal and outputs a second signal; and
    a bias circuit that supplies a bias voltage or a bias current to the first amplifier transistor,
    the first amplifier transistor including a plurality of unit transistors,
    the bias circuit including
        a bias transistor that supplies a bias voltage or a bias current to a base of a unit transistor among the plurality of unit transistors, and
        a voltage supply circuit that supplies a voltage to a base of the bias transistor, wherein at least one element in the voltage supply circuit is disposed within an area formed by the outermost unit transistors among the plurality of unit transistors.

2. The power amplifier circuit according to claim 1, wherein
    the voltage supply circuit includes at least two elements connected in series with each other;
    the one of the two elements is connected to the base of the bias transistor; and
    the other element is grounded.

3. The power amplifier circuit according to claim 1, wherein the voltage supplied to the base of the bias transistor is decreased in accordance with a temperature increase.

4. The power amplifier circuit according to claim 1, wherein the unit transistors are heterojunction bipolar transistors.

5. The power amplifier circuit according to claim 1, wherein each unit transistor has a capacitor connected between the input terminal and the base of each unit transistor.

6. The power amplifier circuit according to claim 1, wherein each unit transistor has a resistor connected between an emitter of the bias transistor and the base of each unit transistor.

7. The power amplifier circuit according to claim 2, wherein each of the two elements includes a heterojunction bipolar transistor.

8. The power amplifier circuit according to claim 7, wherein the heterojunction bipolar transistor of each of the two elements has a base and a collector that are shorted electrically.

9. The power amplifier circuit according to claim 1, wherein the area formed by the outermost unit transistors among the plurality of unit transistors is a substantially rectangular region.

10. A power amplifier circuit comprising:
    a first amplifier transistor that amplifies a first signal inputted into an input terminal and outputs a second signal; and
    a bias circuit that supplies a bias voltage or a bias current to the first amplifier transistor,
    the first amplifier transistor including
        a plurality of unit transistors of a first group and a plurality of unit transistors of a second group,
    the bias circuit including
        a bias transistor that supplies a bias voltage or a bias current to a base of a unit transistor of the second group among the plurality of unit transistors, and
        a voltage supply circuit that supplies a voltage to a base of the bias transistor,
    wherein at least one element in the voltage supply circuit is disposed within an area formed by the outermost unit transistors of the second group among the plurality of unit transistors.

11. The power amplifier circuit according to claim 10, wherein
    the voltage supply circuit includes at least two elements connected in series with each other;

the one of the two elements is connected to the base of the bias transistor; and the other element is grounded.

12. The power amplifier circuit according to claim 10, wherein the voltage supplied to the base of the bias transistor is decreased in accordance with a temperature increase.

13. The power amplifier circuit according to claim 10, wherein the unit transistors of the first group and the second group are heterojunction bipolar transistors.

14. The power amplifier circuit according to claim 10, wherein each unit transistor of the first group and the second group has a capacitor connected between the input terminal and the base of each unit transistor of the first group and the second group.

15. The power amplifier circuit according to claim 10, wherein each unit transistor of the second group has a resistor connected between an emitter of the bias transistor and the base of each unit transistor of the second group.

16. The power amplifier circuit according to claim 11, wherein each of the two elements includes a heterojunction bipolar transistor.

17. The power amplifier circuit according to claim 16, wherein the heterojunction bipolar transistor of each of the two elements has a base and a collector that are shorted electrically.

18. A power amplifier circuit comprising:
a first amplifier transistor that amplifies a first signal inputted into an input terminal and outputs a second signal; and
a bias circuit that supplies a bias voltage or a bias current to the first amplifier transistor,
the first amplifier transistor including
a plurality of unit transistors of a first group and a plurality of unit transistors of a second group,
the bias circuit including
a first bias transistor that supplies a first bias voltage or a first bias current to a base of a unit transistors of the first group among the plurality of unit transistors,
a second bias transistor that supplies a second bias voltage or a second bias current to a base of a unit transistors of the second group among the plurality of unit transistors,
a first voltage supply circuit that supplies a first voltage to a base of the first bias transistor, and
a second voltage supply circuit that supplies a second voltage to a base of the second bias transistor,
wherein at least one element in the second voltage supply circuit is disposed within an area formed by the outermost unit transistors of the second group among the plurality of unit transistors.

19. The power amplifier circuit according to claim 18, wherein
the first voltage supply circuit includes at least two elements connected in series with each other;
the one of the two elements is connected to the base of the first bias transistor; and
the other element is grounded; and
the second voltage supply circuit includes at least two elements connected in series with each other;
the one of the two elements is connected to the base of the second bias transistor; and
the other element is grounded.

20. The power amplifier circuit according to claim 18, wherein
the first voltage supplied to the base of the first bias transistor is decreased in accordance with a temperature increase; and
the second voltage supplied to the base of the second bias transistor is decreased in accordance with a temperature increase.

* * * * *